United States Patent
Wehrhan et al.

(10) Patent No.: US 7,679,806 B2
(45) Date of Patent: Mar. 16, 2010

(54) METHOD FOR MAKING OPTICAL ELEMENTS FOR MICROLITHOGRAPHY, THE LENS SYSTEMS OBTAINED BY THE METHOD AND THEIR USES

(75) Inventors: Gunther Wehrhan, Jena (DE); Regina Martin, Jena (DE); Lutz Parthier, Kleinmachnow (DE); Joerg Staeblein, Jena (DE); Martin Letz, Mainz (DE); Jochen Alkemper, Klein-Winternheim (DE); Konrad Knapp, Jena (DE); Klaus Petermann, Wedel (DE)

(73) Assignee: Schott AG, Mainz (DE)

( * ) Notice: Subject to any disclaimer, the term of this patent is extended or adjusted under 35 U.S.C. 154(b) by 311 days.

(21) Appl. No.: 11/369,306

(22) Filed: Mar. 7, 2006

(65) Prior Publication Data

US 2006/0245043 A1 Nov. 2, 2006

Related U.S. Application Data

(60) Provisional application No. 60/714,091, filed on Sep. 2, 2005.

(30) Foreign Application Priority Data

| Mar. 8, 2005 | (DE) | 10 2005 010 655 |
| Aug. 30, 2005 | (DE) | 10 2005 041 119 |
| Sep. 2, 2005 | (DE) | 10 2005 041 839 |
| Feb. 1, 2006 | (DE) | 10 2006 004 904 |

(51) Int. Cl.
 *G02F 1/01* (2006.01)
 *G06K 7/10* (2006.01)
 *F21V 9/06* (2006.01)

(52) U.S. Cl. .................. 359/256; 359/350; 359/361; 359/649; 359/642; 359/720; 359/352; 359/494; 359/499; 355/53; 355/67; 501/120

(58) Field of Classification Search .............. 359/350, 359/352, 361, 499, 796, 494, 496, 497, 256, 359/885, 642, 649, 754, 712, 718–720; 501/120; 355/67, 30, 53, 69, 71; 264/1.32; 249/102; 438/514, 530, 357, 419, 545, 546, 552; 117/92, 117/94, 96–98, 73, 101–103; 257/647, 539
See application file for complete search history.

(56) References Cited

U.S. PATENT DOCUMENTS

| 4,983,555 | A | * | 1/1991 | Roy et al. | 501/120 |
| 5,001,093 | A | * | 3/1991 | Roy et al. | 501/120 |
| 5,082,739 | A | * | 1/1992 | Roy et al. | 501/120 |
| 5,244,849 | A | * | 9/1993 | Roy et al. | 501/120 |
| 6,177,151 | B1 | | 1/2001 | Chrisey et al. | 427/596 |
| 6,765,717 | B2 | * | 7/2004 | Allan et al. | 359/350 |
| 6,806,039 | B2 | * | 10/2004 | Allan et al. | 430/320 |
| 6,813,070 | B2 | * | 11/2004 | Oyama | 359/361 |
| 6,844,972 | B2 | * | 1/2005 | McGuire, Jr. | 359/494 |
| 7,009,769 | B2 | * | 3/2006 | Hoffman et al. | 359/494 |
| 7,163,649 | B2 | * | 1/2007 | Burnett et al. | 252/584 |
| 7,208,044 | B2 | * | 4/2007 | Zurbuchen | 117/94 |
| 7,375,897 | B2 | * | 5/2008 | Schuster | 359/649 |
| 2002/0185611 | A1 | | 12/2002 | Menapace et al. | 250/492.1 |
| 2006/0066962 | A1 | * | 3/2006 | Totzeck et al. | 359/819 |
| 2006/0146411 | A1 | * | 7/2006 | Schuster | 359/619 |
| 2006/0238735 | A1 | * | 10/2006 | Kamenov et al. | 355/67 |
| 2007/0035848 | A1 | * | 2/2007 | Schuster | 359/649 |
| 2007/0091451 | A1 | * | 4/2007 | Schuster | 359/649 |
| 2008/0198455 | A1 | * | 8/2008 | Totzeck et al. | 359/499 |

FOREIGN PATENT DOCUMENTS

| EP | 1 130 419 | 2/2001 |
| JP | 2001253716 | 9/2001 |
| WO | 2005/059618 | 6/2005 |

OTHER PUBLICATIONS

Burnett J H et al: "High Index Materials for 193 NM Immersion Lithography" Proceedings of the SPIE; Conference: Optical Microlithography XNIII, San Jose, CA, USA; Conference Date: Mar. 1, 2005, BD. 5754, May 2004, pp. 611-621, XP009051940.

Burnett J H et al: "High Index Materials for 193 NM and 157 NM Immersion Lithography" International Symposium on Immersioin & 157 NM Lithography, (Powerpoint Presentation), (Online), Feb. 8, 2004, XP001207229. Internet: HTTP://WWW.SEMATECH.ORG/RESOURCES/LITHO/MEETINGS/IMMERSION/20040803/DAY_1_PRESENTATIONS/1-11_NIST_BURNETT.PDF>(Apr. 7, 2006).

Nishimatsu T et al: "Band Structures of Perovskite-Like Flourides for Vacuum-Ultraviolet-Transparent Lens Materials" Japanese Journal of Applied Physics, Japan Society of Applied Physics, Tokyo, Japan, BD. 41, NR. 4A, Part 2, Apr. 1, 2002, pp. L365-L367, XP001168678 ISSN: 0021-4922.

* cited by examiner

*Primary Examiner*—Loha Ben
(74) *Attorney, Agent, or Firm*—Michael J. Striker

(57) ABSTRACT

The optical elements for ultraviolet radiation, especially for microlithography, are made from cubic granet, cubic spinel, cubic perovskite and/or cubic M(II)- as well as M(IV)-oxides. The optical elements are made from suitable crystals of $Y_3Al_5O_{12}$, $Lu_3Al_5O_{12}$, $Ca_3Al_2Si_3O_{12}$, $K_2NaAlF_6$, $K_2NaScF_6$, $K_2LiAlF_6$ and/or $Na_3Al_2Li_3F_{12}$, $(Mg, Zn)Al_2O_4$, $CaAl_2O_4$, $CaB_2O_4$ and/or $LiAl_5O_8$, $BaZrO_3$ and/or $CaCeO_3$. A front lens used in immersion optics for microlithography at wavelengths under 200 nm is an example of a preferred optical element of the present invention.

10 Claims, No Drawings

7,679,806 B2

METHOD FOR MAKING OPTICAL ELEMENTS FOR MICROLITHOGRAPHY, THE LENS SYSTEMS OBTAINED BY THE METHOD AND THEIR USES

CROSS-REFERENCES

The invention described and claimed hereinbelow is also disclosed in U.S. Provisional application Ser. No. 60/714,091, filed Sep. 2, 2005, which provides a basis for a claim of priority under 35 U.S.C. 119 (e) for the present invention.

The present invention is also described and claimed, in part or in its entirety, in the following German Patent Applications DE 10 2005 010 655.2, filed Mar. 8, 2005; DE 10 2005 041 119.3, filed Aug. 30, 2005; DE 10 2005 041 839.2, filed Sep. 2, 2005; and DE 10 2006 004 904.7, filed Feb. 1, 2006. The foregoing German Patent Applications provide the basis for a claim of priority for the present invention under 35 U.S.C. 119 (a).

BACKGROUND OF THE INVENTION

1. Field of the Invention

The present invention relates to an improved method of making optical elements for microlithography, to optics made by the method and to electronic components and devices including the optics.

2. Related Art

Many electronic circuits are arranged in close proximity to each other in an electronic computer or controller. They are also called integrated circuits (IC) or chips. Electronic circuits are possible, which can perform many millions of circuit operations, by sophisticated arrangements. Because of the ever increasing computational and/or circuit functions of these circuits they are arranged in an ever-smaller space, i.e. their packing density is always becoming greater. According to the so-called Moore's law during controlled miniaturization of these circuits their computational power and/or processing speed doubles every 18 to 24 months. In order to achieve this it is necessary to continually make smaller transistors for this sort of processing and/or control circuit and to arrange them closer and closer above or next to each other. Only in this way miniaturization may permanently reduce the dissipated heat and the processing times.

Microlithography is used to make these types of miniaturized circuits. In microlithography a light-sensitive lacquer, a so-called photo resist, is illuminated by an expensive optical system with light. In this way images of previously designed conductor strips and circuits are produced on the photo lacquer. Further processing of these images produces an entire network of integrated circuits. The extent of the miniaturization of these circuits depends on the respective wavelengths of the light used during microlithography. Currently irradiating wavelengths in the UV, especially the deep UV range, are used in microlithography. For this purpose especially coherent light, particularly laser light, and of course from an excimer laser, such as a KrF laser with wavelengths of 248 nm, an ArF laser with wavelengths of 193 nm, and a $F_2$ laser with a wavelength of 157 nm, can be used. In this way it is possible to make chip structures with a width of less than 100 nm.

However it is not only necessary to reduce the wavelength of the irradiating laser light to miniaturize chip structures, but also to improve the imaging precision of the entire irradiating optical system, i.e. the optical resolution of the system, must be improved.

From microscope engineering it is now known that the resolution of optics can be drastically improved by use of a so-called immersion fluid, which is arranged between the object being studied and the objective. Immersion attachments (e.g. Twinscan™ of ASML) have already been developed for commercially available lithography units and for fully functional lithography units, which however still contain conventional lens system.

Thus, for example, J. H. Burnett, et al, in "High Index Materials for 193 and 157 nm Immersion Lithography", International Symposium on Immersion and 157 nm Lithography, International Symposium on Immersion and 157 nm Lithography, Vancouver, Aug. 2, 2004, describes the use of materials with a high index of refraction as materials for lens systems in Immersion photolithography. According to that reference the index of refraction should be substantially larger than that of water in order to obtain a maximum numerical aperture at a given wavelength. Thus Burnett, et al, recommends the use of the alkaline earth fluorides, $CaF_2$, $SrF_2$, and/or $BaF_2$, which have an absolute refractive index of 1.5 to 1.58 at a wavelength of 193 nm and of 1.56 to 1.66 at 157 nm. Furthermore mixed crystals of the general formula $Ba_xSr_{1-x}F_2$ and $Ba_xCa_{1-x}F_2$ for x=0 to 1 and $Ba_xCa_{1-x}F_2$ with x about 0.1 are suggested for the optical elements. Also alkaline earth oxides, such as MgO, CaO, SrO and BaO, are proposed as possible lens materials. It is also possible to compensate the intrinsic birefringence by mixing these oxides according to this reference. Especially CaO can compensate the birefringence and at the same time increases the index of refraction.

However it has been shown that large-volume single crystals, which have the uniformity required for making this sort of lens, can be drawn from the melt only with difficulty with the suggested materials by means of known techniques. Furthermore the phase diagram for the composition, which is required to obtain a high index of refraction, is extremely critical and is characterized by a melting point that is reach only with difficulty by known crystal growing techniques. Finally no sufficient optical homogeneity is achieved with these mixtures.

SUMMARY OF THE INVENTION

It is an object of the invention to provide optical elements, lenses and/or lens systems, which have a high resolution and/or imaging sharpness at the above-stated wavelengths and which are especially suitable for immersion microlithography.

It is a further object of the present invention to provide materials that are optically isotropic, and may be made into large single crystalline bodies with dimensions of at least 150 mm to 100 mm from a melt by means of currently known processes, so that the optical properties of suitable crystal materials include a stress birefringence of less than 1 nm/cm at a wavelength of 193 nm, a uniformity $\Delta n$ of less than 1 ppm and a spectral absorption coefficient (initial absorption) at 193 nm, $K_{int}$, of less than or equal to $2\times10^{-3}$ cm$^{-1}$, e.g. at a layer thickness of 100 mm.

It is an additional object of the present invention to provide materials for the optical elements, lens and/or lens systems, especially for microlithography, that are as schlieren-free and inclusion-free as possible.

According to the invention the optical elements for ultraviolet radiation, such as lenses, especially for microlithography, are made from materials or themselves comprise cubic garnet, cubic spinel, cubic perovskite, cubic M(II)-oxides and cubic M(IV)-oxides. The optical elements are preferably made from single crystals of the foregoing materials.

In preferred embodiments of the invention the cubic garnet is $Y_3Al_5O_{12}$, $Lu_3Al_5O_{12}$, $Ca_3Al_2Si_3O_{12}$, $K_2NaAlF_6$, $K_2NaScF_6$, $K_2LiAlF_6$ and/or $Na_3Al_2Li_3F_{12}$. The cubic spinel is $(Mg, Zn)Al_2O_4$, $CaAl_2O_4$, $CaB_2O_4$ and/or $LiAl_5O_8$. The cubic perovskite is $BaZrO_3$ and/or $CaCeO_3$. The cubic M(II)-oxides and cubic M(IV)-oxides are preferably MgO and/or (Mg, Zn)O.

In further preferred embodiments of the invention the cubic garnet has a general formula of $(A_{1-x}D_x)_3Al_2O_{12}$, wherein A and D are the same or different, and each is selected from the group consisting of Ce, Pr, Nd, Pm, Sm, Eu, Gd, Tb, Dy, Ho, Er, Tm, Yb, Lu, Y and/or Sc, and wherein $0 \leq x \leq 1$.

The preferred optical elements made from these materials include lenses, prisms, light conducting rods, optical windows, optical components for DUV photolithography and/or front lenses. A front lens used in immersion optics for microlithography is a particularly preferred optical component of the invention.

The present invention also includes a lens system including optical components made from cubic garnet, cubic spinel, cubic perovskite and/or cubic M(II)- as well as cubic M(IV)-oxides and preferably includes at least two optical components of this type made from these materials. The lens system is preferably a projection system. Advantageously at least one of the optical components is made from calcium fluoride and the immersion optics operates at a wavelength under 200 nm.

The present invention also encompasses a method of making an optical element in a lens system for microlithography from cubic garnet, cubic spinel, cubic perovskite and/or cubic M(II)- as well as cubic M(IV)-oxides.

The present invention also encompasses steppers, lasers, especially excimer lasers, computer chips, and integrated circuits and electronic units, which contain this type of computer chip and/or integrated circuit, which each contain an optical element according to the present invention.

It has been found that single crystals of cubic garnet, cubic spinel, cubic perovskite and/or cubic M(II)- as well as M(IV)-oxides are suitable for making lenses of this sort and optical systems. These types of materials may be obtained or made by means of known processes for growing crystals from the melt, for example the Bridgman-Stockbarger process, the Vertical-Gradient-Freeze process, the Czochralski Process or the Nacken-Kyropoulos process. All these processes are methods, in which the crystal is grown from the melt by controlled solidification. Alternatively it is also conceivable to make them by means of a so-called sol-gel technique.

Likewise it is possible to make the foregoing types of materials by sintering of nanoparticles like so-called opto-ceramics. Intrinsic birefringence does not occur in these materials because of the statistical distribution of nanocrystal orientations. For commercial opto-ceramic materials attempts have been made to make materials with a comparatively large crystallite size and/or grain size by the sintering process, especially commercial opto-ceramics having a crystallite size, i.e. a diameter of the crystallites, in a range from about 10 to 100 μm. Even when the starting powder has a diameter in the nanometer range in order to make this sort of commercial opto-ceramic, the sintering process is controlled so that growth of the crystallites to the above-described size occurs.

According to a preferred embodiment of the invention the opto-ceramics have a crystallite size of at most 100 nm, preferably at most 30 nm and most preferably a most 20 nm. According to an especially preferred embodiment the crystallite size amounts to a tenth of the wavelength of the irradiating light. Thus at a wavelength of 193 nm this amounts to a crystallite size of at most about 20 nm. It has been shown that opto-ceramics with a small crystallite size are best suited for microlithography. Opto-ceramic materials with larger crystallite size have too much scattering caused by the intrinsic birefringence due to the random and/or statistical orientation of the individual crystallites and the local fluctuations in the index of refraction at the small irradiating wavelengths used in microlithography of less than 300 nm, preferably less than 200 nm. Thus it is preferable that the opto-ceramic have as uniform as possible a crystallite size distribution, especially a distribution that has a standard deviation Δr/r, which is at most 50%, preferably at most 20%, especially preferably at most 5%, in which the radius of the crystallite is r and Δr is given by the equation:

$$\Delta r = \{\overline{r^2} - \overline{r}^2\}^{1/2}. \qquad (1)$$

Cubic garnets, which are especially suitable, include yttrium-aluminum garnet $Y_3Al_5O_{12}$, lutetium-aluminum garnet (LuAG) $Lu_3Al_5O_{12}$, grossularite $Ca_3Al_2Si_3O_{12}$, elpasolith $K_2NaAlF_6$, $K_2NaScF_6$, $K_2LiAlF_6$ and/or kryolithionite $Na_3Al_2Li_3F_{12}$. Additional garnets include $Tm_3Al_5O_{12}$, $Sc_3Al_5O_{12}$, $Dy_3Al_5O_{12}$ and $YbAl_5O_{12}$.

The invention relates also to optical elements made of cubic garnets, such as the above-mentioned $Y_3Al_5O_{12}$ (YAG) and/or $Lu_3Al_5O_{12}$ (LuAG) in which yttrium and/or lutetium are replaced, in part or in their entirety, by ions of the same valence with comparable ionic radii. It has been shown that this sort of substitution, in part or in its entirety, can shift the absorption limit, which for $Y_3Al_5O_{12}$ (YAG) is at about 185 nm. When tolerable a reduction of transmission occurs here since the working wavelength of an ArF lithography stepper is at 193 nm. Up to now only transmission values of about 50 % were achieved with cubic garnets, such as $Y_3Al_5O_{12}$ (YAG). it is possible to shift the absorption limit further into the short wavelength range by doping and/or substitution. According to the invention is it preferred to mix in those elements and at those concentrations so that the shift amounts to at least 5 nm, preferably at least 8 nm, and especially preferably at least 10 nm. However it is a prerequisite that the added dopant does not have additional absorption or emission bands in the vicinity of the working wavelengths, especially in a range given by 193±10 nm, so that the transmission is not reduced below the required value. Understandably it is also preferred to use those doping agents, which dissolve or are incorporated sufficiently well in the finished crystal.

The present invention also comprises optical elements, which comprise cubic garnets of the general formula:

$$(A_{1-x}D_x)_3Al_5O_{12} \qquad (2),$$

wherein D is an element that is similar to A in regard to valence and ionic radius, so that there is as little lattice distortion as possible. According to the invention the preferred elements A are especially yttrium, Y, rare earths and/or lanthanides, i.e. it is selected from the group consisting of Ce, Pr, Nd, Pm, Sm, Eu, Gd, Tb, Dy, Ho, Er, Tm, Yb and/or Lu, as well as Sc. However the elements Y, Lu, Yb, Tm and Dy as well as Sc are especially preferred. Suitable representatives of the doping agent D are similarly selected from the group consisting of Y, rare earths and scandium. Garnets that have proven to be especially suitable candidates for this sort of doping with other rare earths and/or scandium include yttrium-aluminum garnet, $Y_3Al_5O_{12}$; lutetium-aluminum garnet (LuAG) $Lu_3Al_5O_{12}$; $Dy_3Al_5O_{12}$; $Tm_3Al_5O_{12}$; $Yb_3Al_5O_{12}$ and especially a mixed crystal comprising $(Y_{1-x}Lu_x)_3Al_5O_{12}$.

The parameter "x" means the mole fraction with $0 \leq x \leq 1$. Preferably A and D are different from each other. For the case in which A=D, x=0. According to the invention those mole fractions are preferably employed, which are the same for the melt and the crystal; in other words for which the percentage composition as defined by mole fractions does not change during crystallization. In so far as the optical elements produced by the crystallization have a composition that differs from that of the melt, then according to the invention it is understandable that without more it is possible to maintain the percentage composition constant by adding ingredients that enrich the melt and thus to keep the mole fractions in the solid crystal constant during the entire growing process.

Optical elements according to the invention especially have an absorption limit of <180 nm, particularly <175 nm, but the absorption limits <170 nm and <165 nm are especially preferred. In individual cases a shift of the absorption limit to near 160 nm is possible by means of the doping according to the invention.

Cubic spinel that has proven to be especially suitable in the present invention consists of spinel, i.e. $MgAl_2O_4$, ghanospinel $(Mg, Zn)Al_2O_4$, $CaAl_2O_4$, $CaB_2O_4$ or $LiAl_5O_8$.

Cubic perovskite that has proven to be especially suitable consists of $BaZrO_3$ or $CaCeO_3$. $(Mg, Zn)O$ is an especially preferred cubic (II/IV) oxide.

It has been shown that optical elements may be made, with which the above-described requirements can be achieved, with the above-described types of materials. Optical elements of this sort especially guide electromagnetic waves in a radiation beam in a predetermined manner and/or conduct or bunch them in a certain orientation. This type of electromagnetic wave is especially an electromagnetic wave in the UV, especially the DUV range, which has a wavelength of preferably below 200 nm. Laser light, which is produced with an ArF laser at 193 nm and $F_2$ laser at 157 nm, is most especially preferred.

Optics, like those used for illumination and projection systems in lithographic scanners or steppers, especially comprise the above-described optical elements of the invention. The lens system arranged after the irradiation source and before the photo mask is designated as the irradiation system. The lens system arranged in the beam path after the photo mask, i.e. between the photo mask and the wafer, is designed as the projection system.

The optical elements of the invention especially are lenses or prisms. In a preferred embodiment of the invention they are arranged as terminal lenses, i.e. as a front lens in a projection optic system, most preferably suitable for immersion.

According to a preferred embodiment of the invention the lens system preferably has at least two lenses made from a material, which is selected from the group consisting of cubic garnet, cubic spinel, cubic perovskite and cubic M(II)- as well as M(IV)-oxides. Preferably they are arranged in close proximity to each other in the lens system, so that their relative crystal orientation is designed to reduce the polarization effects due to intrinsic birefringence and/or so that a minimum aberration arises because of intrinsic birefringence. For example two lenses of the same material can be arranged rotated azimuthally so that the intrinsic birefringence of the entire system is minimized, for example about 25% reduced.

According to a further embodiment the lens system comprises at least one other lens made from a second crystalline material, which has an intrinsic birefringence with the opposite sign from that used for at least one first lens, which is made from a material, which is selected from the group consisting of cubic garnet, cubic spinel, cubic perovskite and cubic M(II)- as well as M(IV)-oxides. One such second crystalline material should preferably have an intrinsic birefringence with a magnitude of at least 3 nm/cm and an opposite sign. One or more lenses from this sort of second crystalline material could then be arranged in regard to their crystal orientation relative to the crystal orientation of the first lens in the lens system, so that the aberration occurring in the lens system is reduced. As the second crystalline material a material is suitable, which is selected from the group consisting of cubic garnet, cubic spinel, cubic perovskite and cubic M(II)-M(IV) oxides, but which however is different from the first crystalline material. One such second crystalline material can be an alkaline earth fluoride crystal, such as that consisting of $CaF_2$, $SrF_2$ and/or $BaF_2$; mixed crystals of the formula $A_xB_{1-x}F_2$ and $Ba_xCa_{1-x}F_2$ wherein A, B =Ca, Ba, Sr and $0 \leq x \leq 1$ or an alkaline earth oxide, such as MgO, CaO, SrO and BaO. For example, the intrinsic birefringence of a lens made from LuAG with a value of about +30 nm/cm by one or more lenses from $CaF_2$, which have an intrinsic birefringence of about −3.4 nm/cm. Thus intrinsic birefringence for an entire lens system, for example an irradiating system or projection system, with a value of below 1 nm/cm can be compensated by a suitable lens combination.

Furthermore one or more lenses made from calcium fluoride can be arranged in a lens system, in order to correct further optical errors, especially polarization effects because of intrinsic birefringence of the optical element or elements made from cubic garnet, cubic spinel, cubic perovskite and/or cubic M(II)- as well as M(IV)-oxides.

Preferred immersion liquids are water and doped water, for example doped with fluoride additives. Refractive index values are from 1.4 to 1.5 and may be adjusted above 1.5. Preferably one such immersion liquid has an index of refraction value of greater than 1.5. These liquids are UV permeable and have a similar or equal refractive index to that of the photo lacquer to be illuminated or irradiated. Preferably the refractive index varies from that of the photo lacquer by at most ±0.3, especially at most 0.2. The refractive index of the lens should be at least 0.1, especially at least 0.15 and particularly preferably at least 0.2 greater than that of the liquid and/or the photo lacquer. In this way it is possible to avoid polarization effects and increase the numerical aperture and thus the resolution and/or the sharpness of the images.

It has especially been shown that large-volume single crystals may be made from a melt with the claimed materials, which have the required dimensions, i.e. a diameter of greater than 150 nm, especially greater than 200 nm. Sizes of 250 mm and especially 300 mm are particularly preferred for the single crystal. Furthermore heights of 100, especially 150 and 200 and/or 250 mm, likewise can be made without problems. Preferably crystals of this sort have a stress birefringence, which is less than 1 nm/cm at a wavelength of 193 nm, and a refractive index of greater than 1.6, preferably greater than 1.8, and/or a uniformity Δn of less than 1 ppm. Moreover they are free of schlieren and characterized by an intrinsic birefringence IDB at 193 nm, whose magnitude is less than or equal to 35 nm/cm, preferably less than or equal to 30 nm/cm, and most preferably less than or equal to 20 nm/cm. The IDB can for example be compensated by insertion of foreign ions in the crystal lattice, which produce an IDB in the opposite direction. Furthermore the crystal materials have an electronic band gap $E_{gap}$ greater than, especially much greater than, 6.5 eV. Furthermore they should have a low decadic absorption coefficient of preferably less than or equal to $4 \times 10^{-2}$ $cm^{-1}$, more preferably less than or equal to $2 \times 10^{-2}$.

The intrinsic absorption band limit of the material should be at a wavelength of less than 190 nm, preferably less than 185 nm.

The optical elements and optical imaging systems according to the invention are used for making steppers, lasers, especially excimer lasers, computer chips and integrated circuits and electronic units, which contain those circuits and chips.

EXAMPLE

A crystal consisting of $Lu_3Al_5O_{12}$ was made by the Czochralski process.

The crystal has an intrinsic birefringence of 30(±2) nm/cm and a refractive index of 2.04 at 193 nm. The intrinsic band limit is at a wavelength of about 180 nm. The stress-induced birefringence (SDB) in the "as-grown: state amounts to less than 1 nm/cm.

While the invention has been illustrated and described as embodied in an improved method of making optical elements for microlithography, in optics made by the method and in electronic components and devices including the optics, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. An optical element in a lens system for microlithography, said optical element comprising cubic spinel, and wherein said cubic spinel consists of $(Mg, Zn)Al_2O_4$, $CaAl_2O_4$, $CaB_2O_4$ and/or $LiAl_5O_8$.

2. An optical element in a lens system for microlithography, said optical element comprising cubic perovskite, and wherein said cubic perovskite consists of $BaZrO_3$ and/or $CaCeO_3$.

3. An optical element in a lens system for microlithography, said optical element comprising cubic M(II)-oxides and cubic M(IV)-oxides, and wherein said cubic M(II)-oxides and said cubic M(IV)-oxides are MgO and (Mg, Zn)O.

4. An optical element in a lens system for microlithography, said optical element comprising at least one material selected from the group consisting of cubic garnet, cubic spinel, cubic perovskite, cubic M(II)-oxides and cubic M(IV)-oxides, wherein said at least one material is crystalline and has a stress birefringence of less than 1 nm/cm at a wavelength of 193 nm, a uniformity of refractive index $\Delta n$ of less than 1 ppm and a spectral absorption coefficient, $K_{ini}$, at 193 nm of less than or equal to $2 \times 10^{-3}$ cm$^{-1}$.

5. A method of making an optical element for ultraviolet radiation, said method comprising the steps of:
   a) growing at least one single crystal of at least one material from a melt, said at least one material being selected from the group consisting of cubic garnet, cubic spinel, cubic perovskite, cubic M(II)-oxides and cubic M(IV)-oxides; and
   b) forming said optical element from said at least one single crystal;
   wherein said at least one single crystal is grown from the melt by a Bridgman-Stockbarger process, a Vertical-Gradient-Freeze process, a Czochralski Process, or a Nacken-Kyropoulos process.

6. A method of making an optical element for ultraviolet radiation, said method comprising the steps of:
   a) providing a powder of nanoparticles, said nanoparticles comprising at least one material, said at least one material being selected from the group consisting of cubic garnet, cubic spinel, cubic perovskite and cubic M(II)-oxides;
   b) sintering said powder of nanoparticles to form an opto-ceramic material; and
   c) forming the optical element from said opto-ceramic material.

7. An optical element in a lens system for microlithography, said optical element comprising at least one material selected from the group consisting of cubic perovskite, $Lu_3Al_5O_{12}$, $(Mg, Zn)Al_2O_4$, MgO and (Mg, Zn)O;
   wherein said at least one material is crystalline and has a stress birefringence of less than 1 nm/cm at a wavelength of 193 nm, a uniformity of refractive index $\Delta n$ of less than 1 ppm and a spectral absorption coefficient, $K_{ini}$, at 193 nm of less than or equal to $2 \times 10^{-3}$ cm$^{-1}$.

8. A method of making an optical element for ultraviolet radiation, said method comprising the steps of:
   a) growing at least one single crystal of at least one material from a melt, said at least one material being selected from the group consisting of cubic perovskite, $Lu_3Al_5O_{12}$, $(Mg, Zn)Al_2O_4$, MgO and (Mg, Zn)O; and
   b) forming said optical element from said at least one single crystal,
   wherein the at least one single crystal is grown from the melt by a Bridgman-Stockbarger process, a Vertical-Gradient-Freeze process, a Czochralski Process, or a Nacken-Kyropoulos process.

9. A method of making an optical element for ultraviolet radiation, said method comprising the steps of:
   a) providing a powder of nanoparticles, said nanoparticles comprising cubic perovskite, $Lu_3Al_5O_{12}$, $(Mg, Zn)Al_2O_4$, MgO and (Mg, Zn)O;
   b) sintering said powder of nanoparticles to form an opto-ceramic material having a crystallite size in a range of from about 10 to 100 μm; and
   c) forming the optical element from said opto-ceramic material.

10. An optical element in a lens system for microlithography, said optical element comprising at least one cubic garnet, wherein said at least one cubic garnet consists of $K_2NaAlF_6$, $K_2NaScF_6$, $K_2LiAlF_6$ and/or $Na_3Al_2Li_3F_{12}$.

* * * * *